United States Patent [19]
Kohno

[11] Patent Number: 5,295,098
[45] Date of Patent: Mar. 15, 1994

[54] SEMICONDUCTOR MEMORY DEVICE HAVING HIGH-SPEED THREE-STATE DATA OUTPUT BUFFER CIRCUIT WITHOUT VOLTAGE FLUCTUATION ON POWER VOLTAGE LINES

[75] Inventor: Takaki Kohno, Tokyo, Japan
[73] Assignee: NEC Corporation, Tokyo, Japan
[21] Appl. No.: 867,356
[22] Filed: Apr. 13, 1992

[30] Foreign Application Priority Data
Apr. 30, 1991 [JP] Japan ................... 3-126650

[51] Int. Cl.$^5$ .......................... G11C 7/00; G11C 8/00
[52] U.S. Cl. ................... 365/189.05; 365/168; 365/189.08; 365/233.5
[58] Field of Search ............. 365/168, 189.05, 189.08, 365/233.5, 191

[56] References Cited
U.S. PATENT DOCUMENTS

| | | | |
|---|---|---|---|
| 4,604,731 | 8/1986 | Konishi | 365/189.05 |
| 4,858,197 | 8/1989 | Aono et al. | 365/233.5 |
| 4,879,693 | 11/1989 | Ferrant | 365/233.5 |
| 4,953,130 | 8/1990 | Houston | 365/233.5 |
| 5,060,196 | 10/1991 | Pae et al. | 365/189.05 |

Primary Examiner—Eugene R. LaRoche
Assistant Examiner—Michael C. Kessell
Attorney, Agent, or Firm—Sughrue, Mion, Zinn, Macpeak & Seas

[57] ABSTRACT

A dynamic random access memory device is equipped with an output data buffer circuit for driving an output data pin, and the output data buffer circuit comprises an output inverter coupled with the data pin, a driving unit responsive to a data bit on a data line pair in the absence of a high-impedance control signal for controlling the output inverter, the driving unit being further operative to cause the output inverter to enter high-impedance state in the presence of the high-impedance control signal, and a switching transistor coupled between the data pin and a constant voltage source and responsive to a preceding signal for coupling the output data pin with the constant voltage source, wherein the high-impedance control signal and the preceding signal are supplied to the output data buffer circuit before reaching the data bit thereto so that power voltage lines are prevented from voltage fluctuation without sacrifice of switching speed.

6 Claims, 9 Drawing Sheets

SEMICONDUCTOR MEMORY DEVICE HAVING HIGH-SPEED THREE-STATE DATA OUTPUT BUFFER CIRCUIT WITHOUT VOLTAGE FLUCTUATION ON POWER VOLTAGE LINES

FIELD OF THE INVENTION

This invention relates to a semiconductor memory device and, more particularly, to a data output buffer circuit incorporated in the semiconductor memory device.

DESCRIPTION OF THE RELATED ART

Referring first to FIG. 1 of the drawings, a prior art semiconductor memory device is fabricated on a single semiconductor chip 1, and largely comprises a memory cell array 2 and peripheral units. The memory cell array 2 is fabricated from a plurality of memory cells arranged in rows and columns, and each of the memory cells stores a data bit. A plurality of bit line pairs BLP1 to BLPn are associated with the memory cell array 2, and are connectable with any one of the rows of the memory cell array 2. A plurality of word lines W1 to Wm are coupled with the rows of the memory cell array 2, and the word lines W1 to Wm are selectively driven to an active level.

Various peripheral units are provided in the semiconductor memory device. Namely, an address buffer circuit 3 is supplied with an address signal, and distributes the address bits to a row address decoder circuit 4 and a column address decoder circuit 5. The row address decoder circuit 4 allows one of the word lines W1 to Wm to be driven to the active level. When one of the word lines W1 to Wm is driven to the active level, the associated row of the memory cell array 2 is coupled with the bit line pairs BLP1 to BLPn, and data bits are transferred therebetween. The column address decoder circuit 5 controls a column selector circuit 6, and the column selector circuit 6 selectively couples the bit line pairs BLP1 to BLPn with a data line pair DLP. Since a data bit is propagated in the form of differential voltage level, a sense amplifier circuit 7 is coupled with the data line pair DLP, and the differential voltage level is developed by the sense amplifier circuit 7. The sense amplifier circuit 7 supplies either high or low voltage level indicative of the data bit through an input signal line SI to an output data buffer circuit 8, and the output data buffer circuit 8 produces an output data signal under the control of an output enable buffer circuit 9. An output enable signal OE is supplied to the output enable buffer circuit 9, and the output enable buffer circuit 9 produces first and second enable signals OEB and OET complementary to each other for the output data buffer circuit 8.

The output data buffer circuit 8 is illustrated in detail in FIG. 2, and largely comprises an input inverter IV1, a first driver unit 8a, a second driver unit 8b and an output inverter IV2. The input inverter IV1 is implemented by a series combination of a p-channel enhancement type field effect transistor QP1 and an n-channel enhancement type field effect transistor QN2 coupled between a power voltage line Vdd and a ground voltage line, and is responsive to the voltage level on the input signal line SI. The output node N1 of the input inverter IV1 is coupled with both of the first and second driver units 8a and 8b, and the first and second enable signals OEB and OET are respectively supplied to the first and second driver units 8a and 8b. The first driver unit 8a comprises a NOR gate NR1 and an inverter circuit IV3 coupled in series, and the second driver unit 8b has a NAND gate ND1 and an inverter circuit IV4 coupled in series. The NOR gate NR1 is implemented by a series combination of p-channel enhancement type field effect transistors QP3 and QP4 coupled between the power voltage line Vdd and an output node N2 as well as a parallel combination of n-channel enhancement type field effect transistors QN5 and QN6 coupled between the output node N2 and the ground voltage line. The output node N1 of the input inverter IV1 is coupled with the gate electrode of the p-channel enhancement type field effect transistor QP4 and with the gate electrode of the n-channel enhancement type field effect transistor QN5, and the first enable signal OEB is supplied to the gate electrode of the p-channel enhancement type field effect transistor QP3 and the gate electrode of the n-channel enhancement type field effect transistor QN6. The NOR gate NR1 thus arranged is enabled with the first enable signal OEB of the low level corresponding to logic "0" level, and serve as a inverter on the voltage level at the output node N1. The inverter circuit IV3 is implemented by a series combination of a p-channel enhancement type field effect transistor QP7 and an n-channel enhancement type field effect transistor QN8 coupled between the power voltage line Vdd and the ground voltage line, and the output node N2 of the NOR gate NR1 is coupled with the gate electrode of the p-channel enhancement type field effect transistor QP7 and with the gate electrode of the n-channel enhancement type field effect transistor QN8. The inverter IV3 is responsive to the voltage level at the output node N2 of the NOR gate NR1, and produces a first driving signal DR1 at the output node N3 thereof. The NAND gate ND1 of the second driver unit 8b comprises a parallel combination of p-channel enhancement type field effect transistors QP9 and QP10 coupled between the power voltage line Vdd and an output node N4, and a series combination of n-channel enhancement type field effect transistors QN11 and QN12 coupled between the output node N4 and the ground voltage line, and is enabled with the second enable signal OET supplied to the gate electrode of the p-channel enhancement type field effect transistor QP10 and the gate electrode of the n-channel enhancement type field effect transistor QN12. While the second enable signal OET is in the high voltage level corresponding to logic "1" level, the p-channel enhancement type field effect transistor QP9 and the n-channel enhancement type field effect transistor QN11 serve as an inverter on the voltage level at the output node N1 of the input inverter IV1. The inverter IV4 associated with the NAND gate ND1 is implemented by a series combination of a p-channel enhancement type field effect transistor QP13 and an n-channel enhancement type field effect transistor QN14 coupled between the power voltage line Vdd and the ground voltage line, and is responsive to the voltage level at the output node N4 of the NAND gate ND1 for producing a second driving signal DR2. The output inverter IV2 is also implemented by a series combination of a p-channel enhancement type field effect transistor QP15 and an n-channel enhancement type field effect transistor QN16 coupled between the power voltage line Vdd and the ground voltage line. The p-channel enhancement type field effect transistor QP15 and the n-channel enhancement type field effect transistor QN16 are respectively responsive to the first and second driving signals DR1 and DR2, and complementarily turn on and off for producing the output data signal on an output signal line SO.

The output data buffer circuit 8 thus arranged behaves as follows. When either high or low voltage level indicative of a data bit is transferred to the output data buffer circuit 8, the output enable buffer circuit 9 produces the first enable signal OEB of the low voltage level and the second enable signal OET of the high voltage level, and the first and second enable signals OEB and OET enable the NOR gate NR1 and the NAND gate ND1. Then, the voltage level on the input signal line SI is inverted three times, and the first and second driving signals DR1 and DR2 allows one of the p-channel enhancement type field effect transistor QP15 and the n-channel enhancement type field effect transistor QN16 to turn on, and the output signal line SO is coupled through the output inverter IV2 with either power or ground voltage line for producing the output data signal. The output signal line SO propagates the output data signal to a data terminal, and the output data signal is transferred from the data terminal through a wiring (not shown) to another semiconductor integrated device.

In general, a large amount of parasitic capacitance is coupled with the data terminal, and is as large as 100 pF. In order to charge or discharge such a large amount of parasitic capacitance at high speed, the output inverter IV2 needs to have large current driving capability, and the p-channel enhancement type field effect transistor QP15 and the n-channel enhancement type field effect transistor QN16 are as wide in channel width as 200 to 300 microns. Since the p-channel enhancement type field effect transistor QP1 and the n-channel enhancement type field effect transistor QN2 are 10 to 20 microns in the channel width, the output inverter IV2 is fabricated from extremely large-sized transistors.

FIGS. 3A and 3B show switching speed of the output data buffer circuit 8. Assuming now that a timer starts upon change of the address signal, the data bit to be accessed reaches the input signal line SI, and, accordingly, changes the voltage level on the input signal line SI at about 60 nanoseconds. If the input signal line SI is stepped up, the output signal line SO is also stepped up at about 90 nanoseconds, and the time interval Tso therebetween is about 30 nanoseconds. However, if the input signal line SI is stepped down, the output signal line SO is stepped down at about 100 nanoseconds, and the time interval Tso' is about 40 nanoseconds. Thus, the time the time interval Tso. The time intervals Tso and Tso starts from the mid point Vsi of the differential voltage on the input signal line SI, i.e., Vdd/2=2.5 volts to a discriminating level on the output signal line SO, and the discriminating level is about 2.0 for logic "1" level and about 0.8 volt for logic "0" level. If the accessed data bit is changed from logic "0" to logic "1", the output inverter IV2 is expected to lift the output signal line SO from zero volts to 2.0 volts, and hence the output signal line SO voltage is changed by at least 2.0 volts. On the other hand, if the accessed data bit is changed from logic "1" to logic "0", the output inverter IV2 is expected to decrease the voltage level on the output signal line SO from 5.0 volts to 0.8 volt, and the difference is 4.2 volts. This is the reason why the time interval Tso' is longer than the time interval Tso.

A problem is encountered in the prior art semiconductor memory device in the trade-off between the switching speed of the output data buffer circuit and stability of the power voltage line Vdd and the ground voltage line. If the output inverter IV2 is implemented by larger sized transistors, the output inverter IV2 rapidly charges and discharges the parasitic capacitance coupled with the data terminal, and the switching speed is improved. However, the larger sized transistors allow a large amount of current to flow therethrough, and the power voltage level or the ground voltage level tends to fluctuate. Since the power voltage level and the ground voltage level are shared between the component circuits of the semiconductor memory device, the other component circuits are affected by the voltage fluctuation, and, accordingly, are much more likely to malfunction.

SUMMARY OF THE INVENTION

It is therefore an important object of the present invention to provide a semiconductor memory device which drives large parasitic capacitance at high speed without voltage fluctuation on power voltage lines.

To accomplish these objects, the present invention proposes to stepwise shift the voltage level on an output signal line.

In accordance with the present invention, there is provided a semiconductor memory device fabricated on a single semiconductor chip, comprising: a) a memory cell array having a plurality of memory cells arranged in rows and columns, and respectively storing data bits; b) a plurality of word lines respectively associated with the rows of the memory cell array, and responsive to an address signal for selectively reading out the data bits from the memory cell array; c) a data selecting means coupled with the memory cell array, and responsive to the address signal for selectively transferring the data bits read out from the memory cell array; d) a control means responsive to variation of the address signal, and producing a high-impedance state control signal and a preceding signal; and e) a data buffer circuit operative to drive a data pin for supplying a data signal to the outside thereof, and comprising e-1) an output inverter coupled with the data pin, e-2) driving means responsive to a data bit on the data selecting means in the absence of the high-impedance control signal for controlling the output inverter, the driving means being further operative to cause the output inverter to enter high-impedance state in the presence of the high-impedance control signal, and e-3) a switching means coupled between the data pin and a constant voltage source, and responsive to the preceding signal for coupling the data pin with the constant voltage source, the high-impedance control signal and said preceding signal being supplied to the driving means and the switching means before reaching the data bit to the driving means so that the data pin is shifted to a predetermined level between high and low voltage levels.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
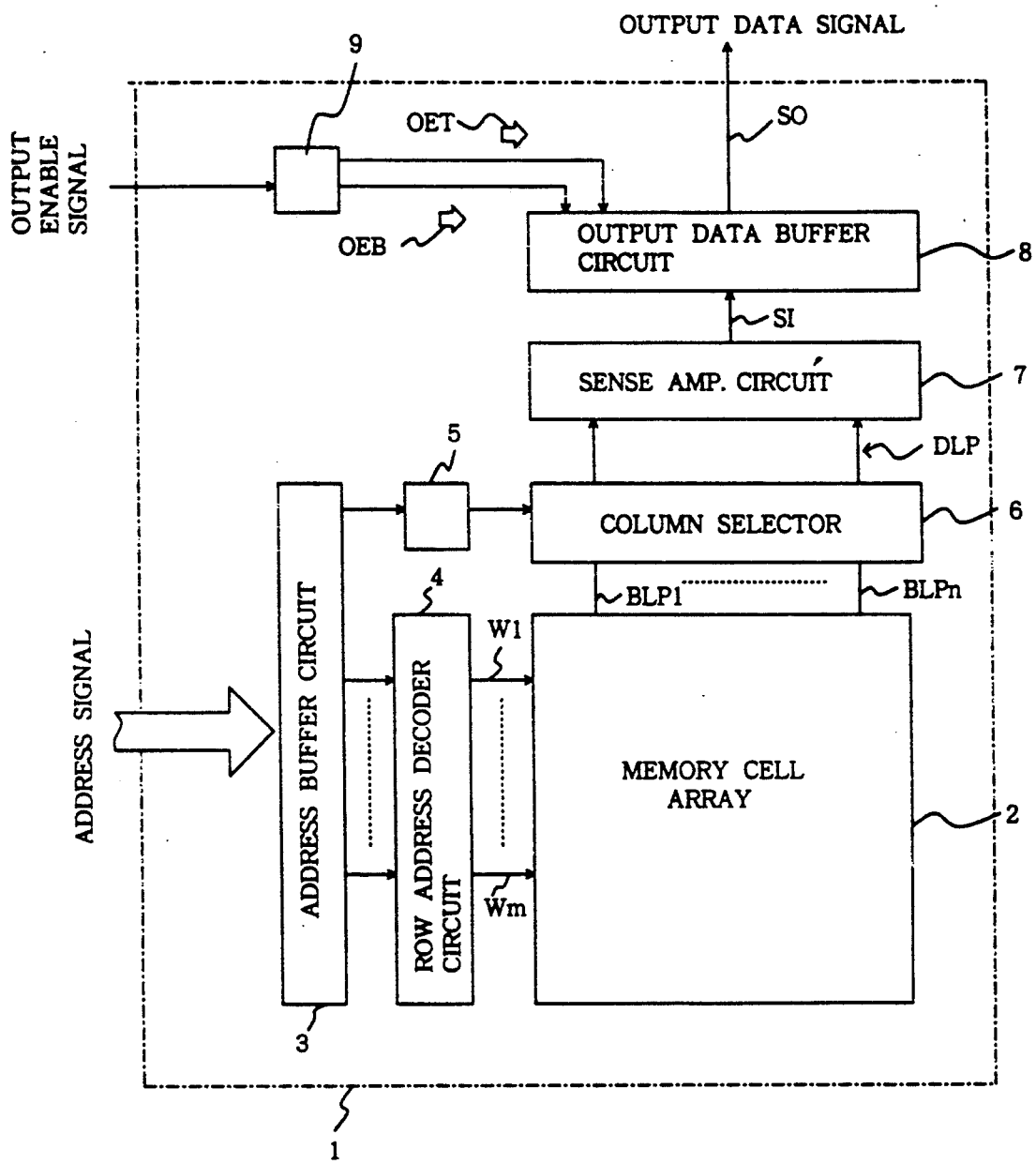
FIG. 1 is a block diagram showing the circuit arrangement of the prior art semiconductor memory device.
Figure 2:
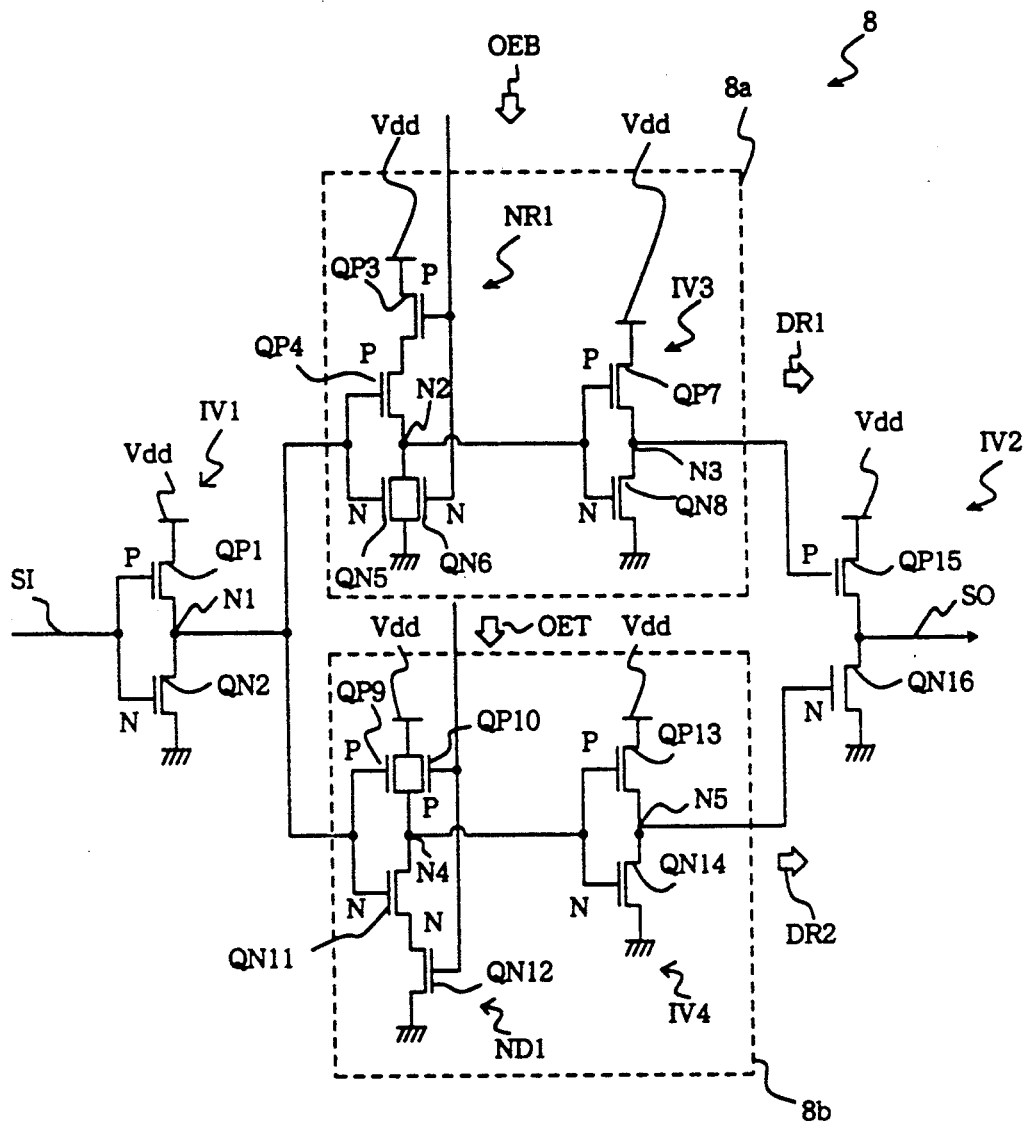
FIG. 2 is a circuit diagram showing the arrangement of the output data buffer circuit incorporated in the prior art semiconductor memory device.
Figure 3A:
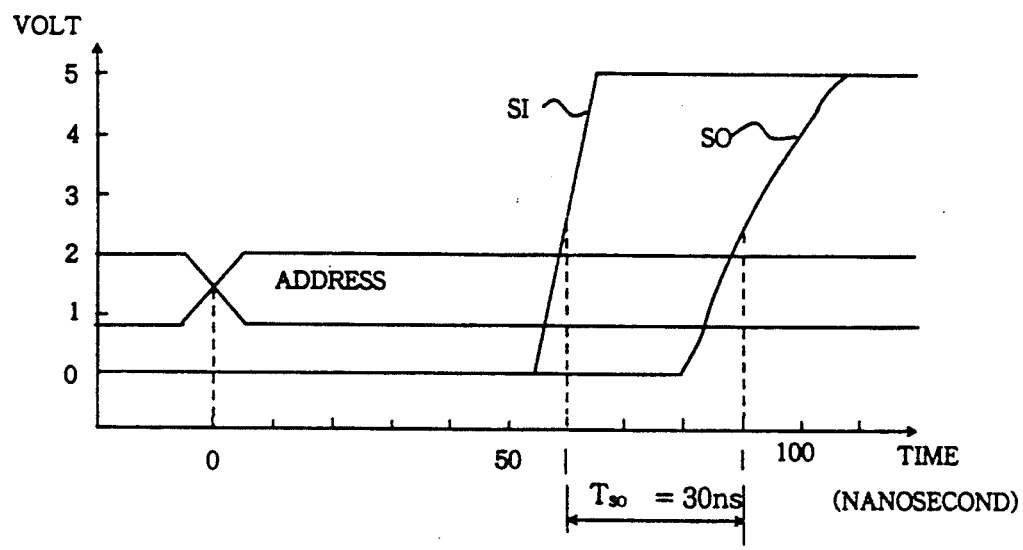
FIGS. 3A and 3B are graphs showing the switching action of the output data buffer circuit.
Figure 3B:
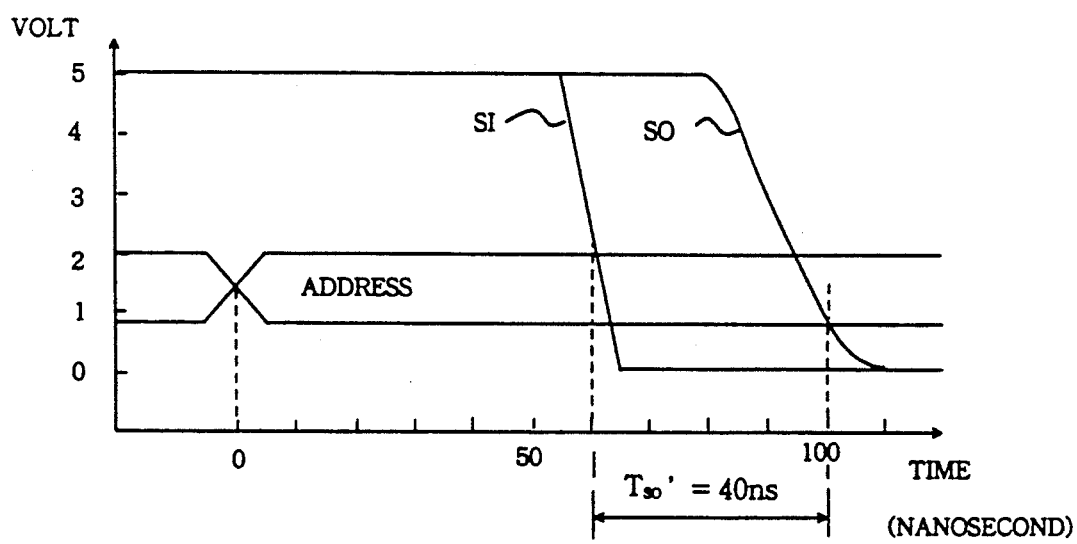
Figure 4:
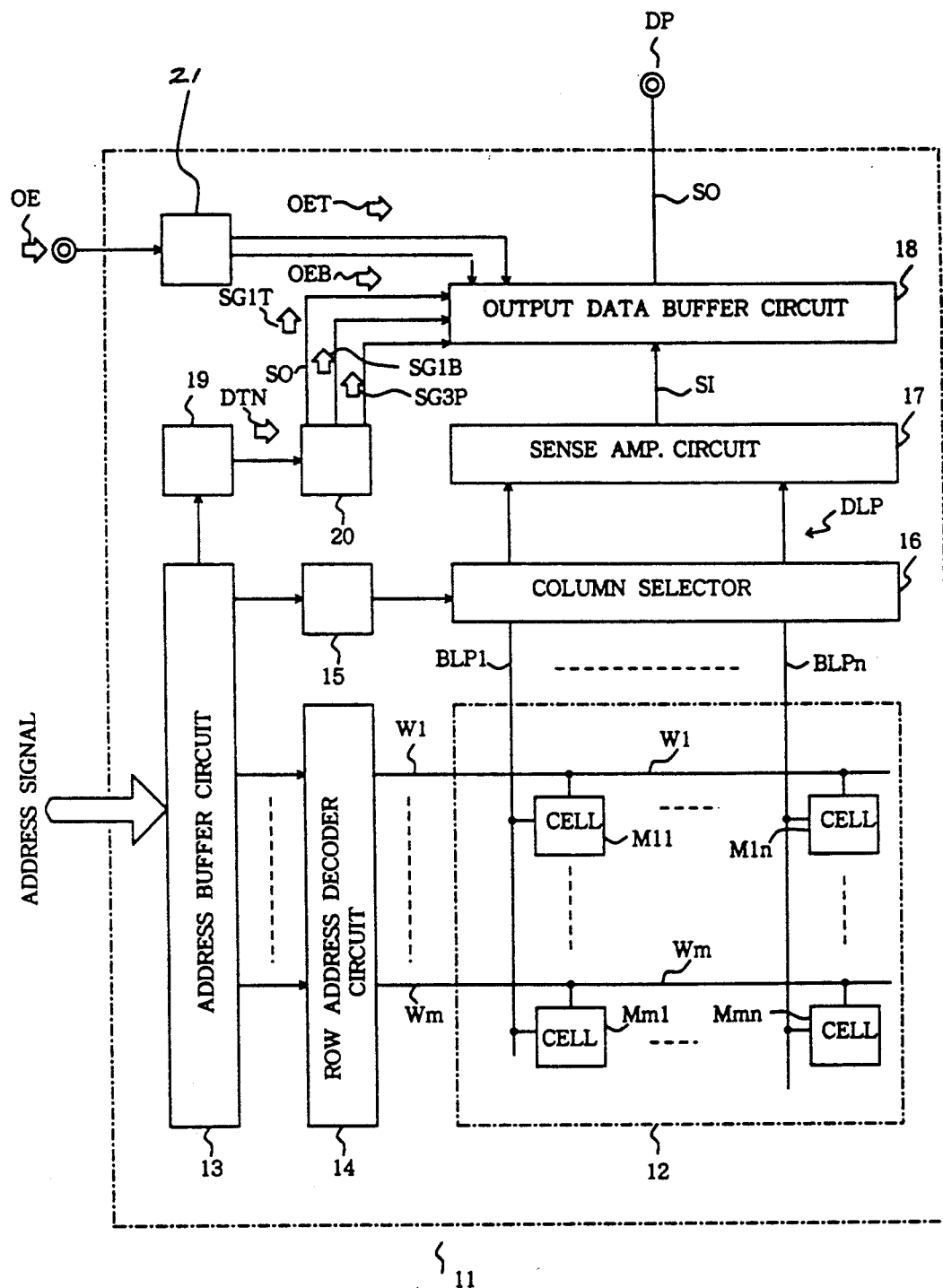
FIG. 4 is a block diagram showing the arrangement of a semiconductor memory device according to the present invention.

Referring to FIG. 4 of the drawings, a semiconductor memory device embodying the present invention is fabricated on a single semiconductor chip 11, and largely comprises a memory cell array 12 and a peripheral circuit group. The memory cell array 12 is fabricated from a plurality of memory cells M11, M1n, Mm1 and Mmn arranged in rows and columns, and each of the memory cells M11 to Mmn stores a data bit. A plurality of bit line pairs BLP1 to BLPn are associated with the columns of the memory cell array 12, and are connectable with any one of the rows of the memory cell array 12. A plurality of word lines W1 to Wm are respectively coupled with the rows of the memory cell array 2, and the word lines W1 to Wm are selectively driven to an active level.

Various peripheral circuits are provided in the semiconductor memory device. Namely, an address buffer circuit 13 is supplied with an address signal, and distributes the address bits to a row address decoder circuit 14 and a column address decoder circuit 15. The row address decoder circuit 14 allows one of the word lines W1 to Wm to be driven to the active level. When one of the word lines W1 to Wm is driven to the active level, the associated row of the memory cell array 12 is coupled with the bit line pairs BLP1 to BLPn, and data bits are transferred therebetween. The column address decoder circuit 15 controls a column selector circuit 16, and the column selector circuit 16 selectively couples the bit line pairs BLP1 to BLPn with a data line pair DLP. Since a data bit is propagated in the form of differential voltage level, a sense amplifier circuit 17 is coupled with the data line pair DLP, and the differential voltage level is developed by the sense amplifier circuit 17. The sense amplifier circuit 17 supplies either high or low voltage level indicative of the data bit through an input signal line SI to an output data buffer circuit 18, and the output data buffer circuit 18 produces an output data signal on the basis of the data bit on the input signal line SI. The output data signal is transferred through the output signal line SO to a data pin DP. In this instance, the bit line pairs BLP1 to BLPn, the column selector 16 associated with the column address decoder circuit 15, a data line pair DLP, a sense amplifier circuit 17 and the input signal line SI as a whole constitute a selecting means.

The address bits are further supplied from the address buffer circuit 13 to an address monitor circuit 19 to see if or not the address indicated by the address bits is changed. Upon change of the address, the address monitor circuit 19 produces a detection signal DTN, and the detection signal DTN is supplied to a control signal generator 20. The control signal generator 20 is responsive to the detection signal DTN, and produces first, second and third control signals SG1T, SG1B and SG3P. The first and second control signals SG1T and SG1B are complementarily shifted between the high voltage level and the low voltage level, and serve as a high-impedance state control signal. On the other hand, the third control signal SG3P serves as a preceding signal.

An output enable buffer 21 is further provided in association with the output data buffer circuit 18, and an output enable signal OE is supplied to the output enable buffer circuit 21. The output enable buffer circuit 21 produces first and second enable signals OEB and OET complementary to each other, and the first and second enable signals OEB and OET are supplied to the output data buffer circuit 18.

Figure 5:
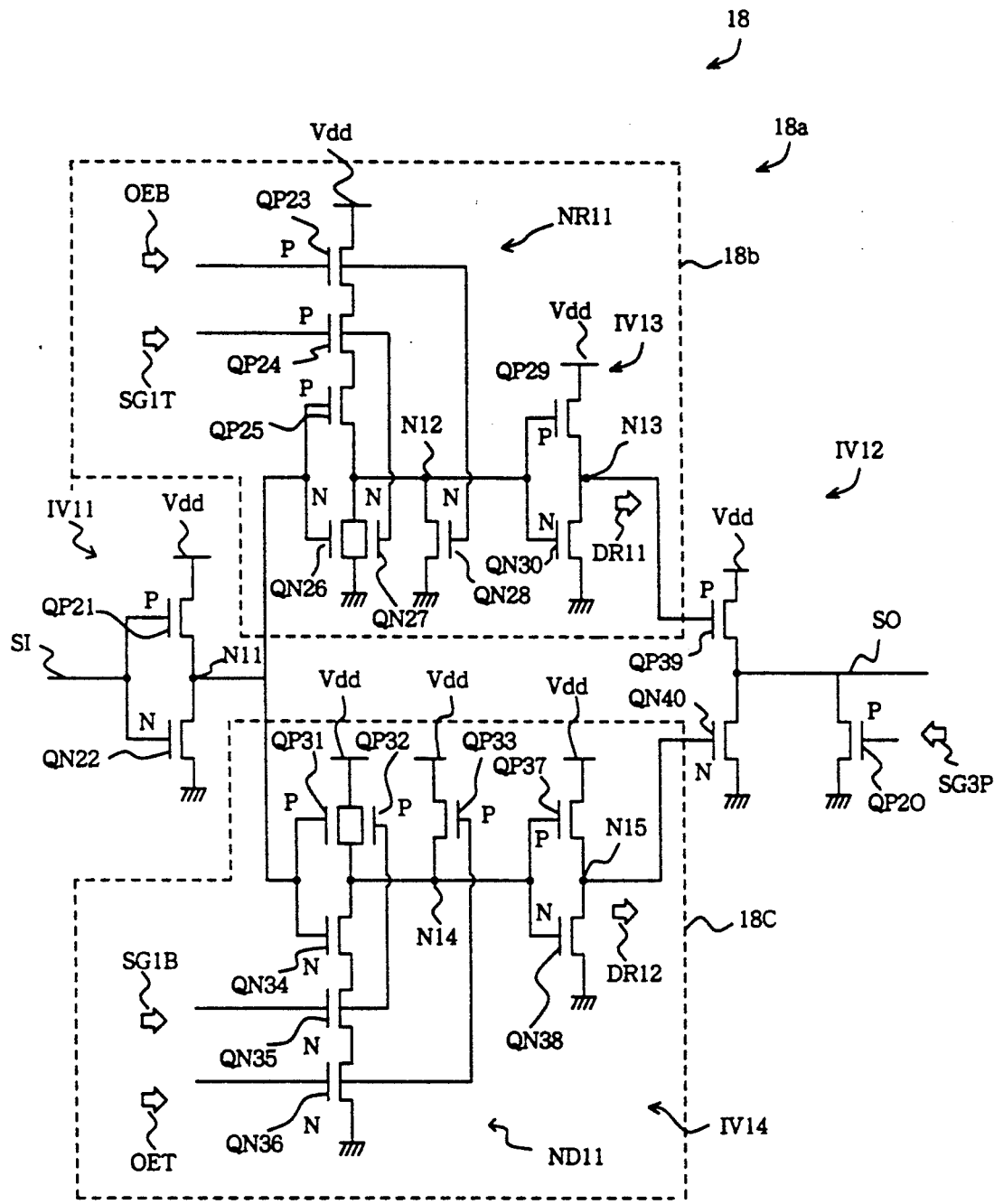
FIG. 5 is a circuit diagram showing the arrangement of an output data buffer circuit incorporated in the semiconductor memory device shown in FIG. 4.

The circuit arrangement of the output data buffer circuit 18 is illustrated in FIG. 5, and largely comprises an input inverter IV11, a driving unit 18a consisting of first and second driving circuits 18b and 18c, an output inverter IV12 and a p-channel enhancement type switching transistor QP20. The third control signal SG3P is supplied to the gate electrode of the p-channel enhancement type switching transistor QP20, and the p-channel enhancement type switching transistor QP20 allows the output signal line SO to go down to a certain voltage level equal to the threshold level Vtp of the switching transistor QP20. When the threshold level Vtp is determined, back-gate biasing effect is taken into account, and the threshold level Vtp is about $Vdd/2 = 2.5$ volts in this instance.

The input inverter IV11 is implemented by a series combination of a p-channel enhancement type field effect transistor QP21 and an n-channel enhancement type field effect transistor QN22 coupled between a power voltage line Vdd and a ground voltage line, and is responsive to the voltage level on the input signal line SI.

The output node N11 of the input inverter IV11 is coupled with both of the first and second driver circuits 18b and 18c, and the first and second enable signals OEB and OET are respectively supplied to the first and second driver circuits 18b and 18c. The first and second control signals SG1T and SG1B are further supplied to the first and second driver circuits 18b and 18c. The first driver circuit 18b comprises a three-input NOR gate NR11 and an inverter circuit IV13 coupled in series, and the second driver circuit 18c has a three-input NAND gate ND11 and an inverter circuit IV14 also coupled in series.

The NOR gate NR11 is implemented by a series combination of p-channel enhancement type field effect transistors QP23, QP24 and QP25 coupled between the power voltage line Vdd and an output node N12 as well as a parallel combination of n-channel enhancement type field effect transistors QN26, QN27 and QN28 coupled between the output node N12 and the ground voltage line. The output node N11 of the input inverter IV11 is coupled with the gate electrode of the p-channel enhancement type field effect transistor QP25 and with the gate electrode of the n-channel enhancement type field effect transistor QN26, and the first enable signal OEB is supplied to the gate electrode of the p-channel enhancement type field effect transistor QP23 and the gate electrode of the n-channel enhancement type field effect transistor QN28. Finally, the first control signal SG1T is supplied to the gate electrode of the p-channel enhancement type field effect transistor QP24 and the gate electrode of the n-channel enhancement type field effect transistor QN27. The NOR gate NR11 thus arranged is enabled with the first enable signal OEB of the low level corresponding to logic "0" level, and produces the high voltage level at the output node N12 only when both of the first control signal SG1T and the output node N11 are in the low voltage level. However, even if the first enable signal OEB is in the low level, at least one of the first control signal SG1T and the output node N11 of the high level decreases the output node N12 to the low level. The inverter circuit IV13 is implemented by a series combination of a p-channel enhancement type field effect transistor QP29 and an n-channel enhancement type field effect transistor QN30 coupled between the power voltage line Vdd and the ground voltage line, and the output node N12 of the NOR gate NR11 is coupled with the gate electrode of the p-channel enhancement type field effect transistor QP29 and with the gate electrode of the n-channel enhancement type field effect transistor QN30. The inverter IV13 is responsive to the voltage level at the output node N12 of the NOR gate NR11, and produces a first driving signal DR11 at the output node N13 thereof.

The NAND gate ND11 of the second driver circuit 18c comprises a parallel combination of p-channel enhancement type field effect transistors QP31, QP32 and QP33 coupled between the power voltage line Vdd and an output node N14, and a series combination of n-channel enhancement type field effect transistors QN34, QN35 and QN36 coupled between the output node N14 and the ground voltage line, and is enabled with the second enable signal OET supplied to the gate electrode of the p-channel enhancement type field effect transistor QP33 and the gate electrode of the n-channel enhancement type field effect transistor QN36. While the second enable signal OET is in the high voltage level corresponding to logic "1" level, the NAND gate ND11 is enabled, and produces the low level in the co-presence of the second control signal SG1B of the high level and the output node N11 of the high level. However, if at least one of the second control signal SG1B and the output node N11 is in the low level, either of or both of the n-channel enhancement type field effect transistors QN34 and QN35 turn off, and at least one of the p-channel enhancement type field effect transistors QP31 and QP32 conducts the output node N14 with the power voltage line Vdd so as to supply the high level at the output node N14. The inverter IV14 associated with the NAND gate ND11 is implemented by a series combination of a p-channel enhancement type field effect transistor QP37 and an n-channel enhancement type field effect transistor QN38 coupled between the power voltage line Vdd and the ground voltage line, and is responsive to the voltage level at the output node N14 of the NAN gate ND11 for producing a second driving signal DR12 at the output node N15.

The output inverter IV12 is also implemented by a series combination of a p-channel enhancement type field effect transistor QP39 and an n-channel enhancement type field effect transistor QN40 coupled between the power voltage line Vdd and the ground voltage line. The p-channel enhancement type field effect transistor QP39 and the n-channel enhancement type field effect transistor QN40 are respectively responsive to the first and second driving signals DR11 and DR12, and complementarily turn on and off for producing the output data signal on an output signal line SO.

The output data buffer circuit 18 thus arranged behaves as follows. When the address signal is changed, the address monitor circuit 19 produces the detection signal DTN, and the control signal generator 20 shifts the first control signal SG1T and the second control signal SG1B to the high level and the low level, respectively. The n-channel enhancement type field effect transistor QN28 and the p-channel enhancement type field effect transistor QP32 turn on, and the inverters IV13 and IV14 respectively produce the first driving signal DR11 of the high level and the second driving signal DR12 of the low level. The first and second driving signals DR11 and DR12 cause the output inverter IV12 to enter high-impedance state.

The control signal generator 20 further produces the third control signal SG3P of the (active) low level, and the p-channel enhancement type switching transistor QP20 can turn on. If the output data signal indicative of the previously accessed data bit is in the low voltage level, the voltage level on the output signal line SO is unchanged. However, if the output signal line SO is in the high level approximately equal to Vdd, the p-channel enhancement type switching transistor QP20 discharges the output signal line SO to 2.5 volts. Thereafter, since the address monitor circuit 19 cancels the detection signal DTN, and the control signal generator 20 shifts the first, second and third control signals SG1T, SG1B and SG3P to the low level, the high level and the high level, respectively. Then, the output data buffer circuit 18 becomes responsive to the data bit on the input signal line SI.

When either high or low voltage level indicative of the accessed data bit is transferred from the sense amplifier circuit 17 to the output data buffer circuit 18, the output enable buffer circuit 19 produces the first enable signal OEB of the low voltage level and the second enable signal OET of the high voltage level, and the first and second enable signals OEB and OET enable the NOR gate NR11 and the NAND gate ND11. Then, the voltage level on the input signal line SI is inverted three times, and the first and second driving signals DR11 and DR12 allow one of the p-channel enhancement type field effect transistor QP39 and the n-channel enhancement type field effect transistor QN40 to turn on, and the output signal line SO is coupled through the output inverter IV12 with either power or ground voltage line for producing the output data signal. The output signal line SO propagates the output data signal to the data terminal DP, and the output data signal is transferred from the data terminal DP through a wiring (not shown) to another semiconductor integrated device.

Figure 6:
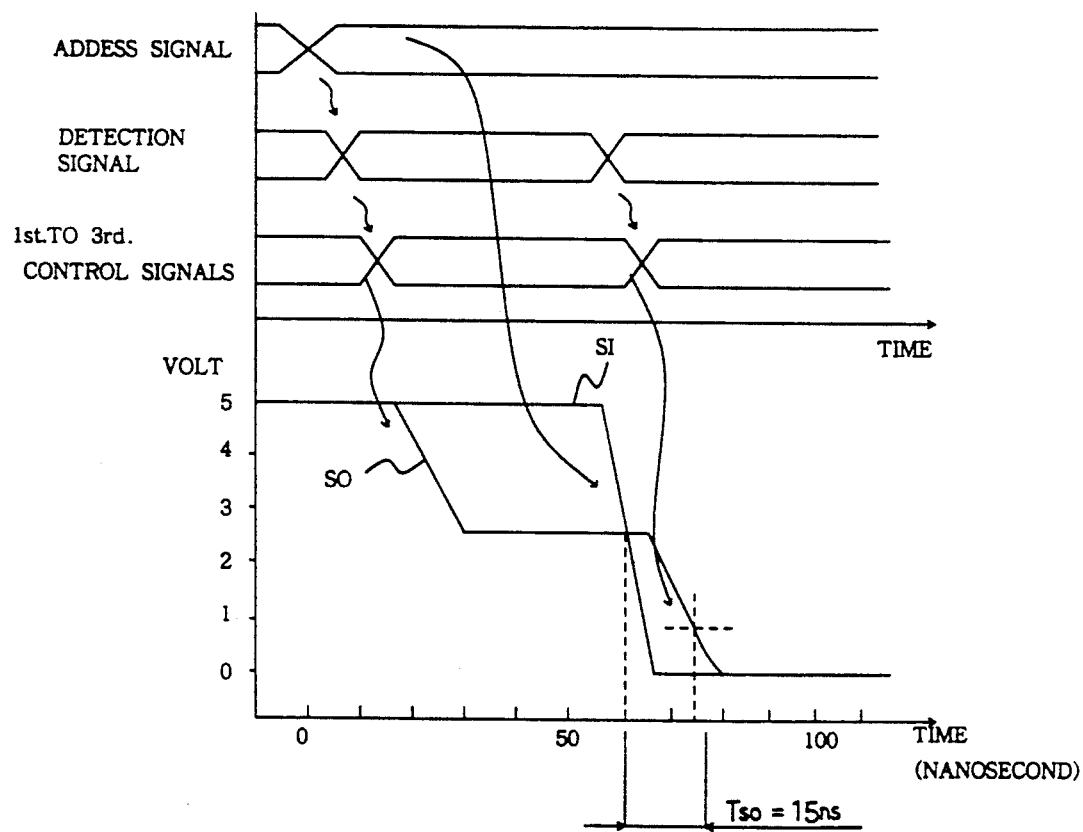
FIG. 6 is a graph showing the switching action of the output data buffer circuit shown in FIG. 5.

The control sequence of the output data buffer circuit 18 is summarized in FIG. 6 on the assumption that the output data signal is decayed from the high level to the low level, and the time interval Tso is decreased to about 15 nanoseconds. Moreover, since the output inverter IV12 drives the output signal line SO from 2.5 volts to 0.8 volt, the power and ground voltage lines are less liable to fluctuate, and any malfunction hardly takes place in the other component circuits.

Second Embodiment

Figure 7:
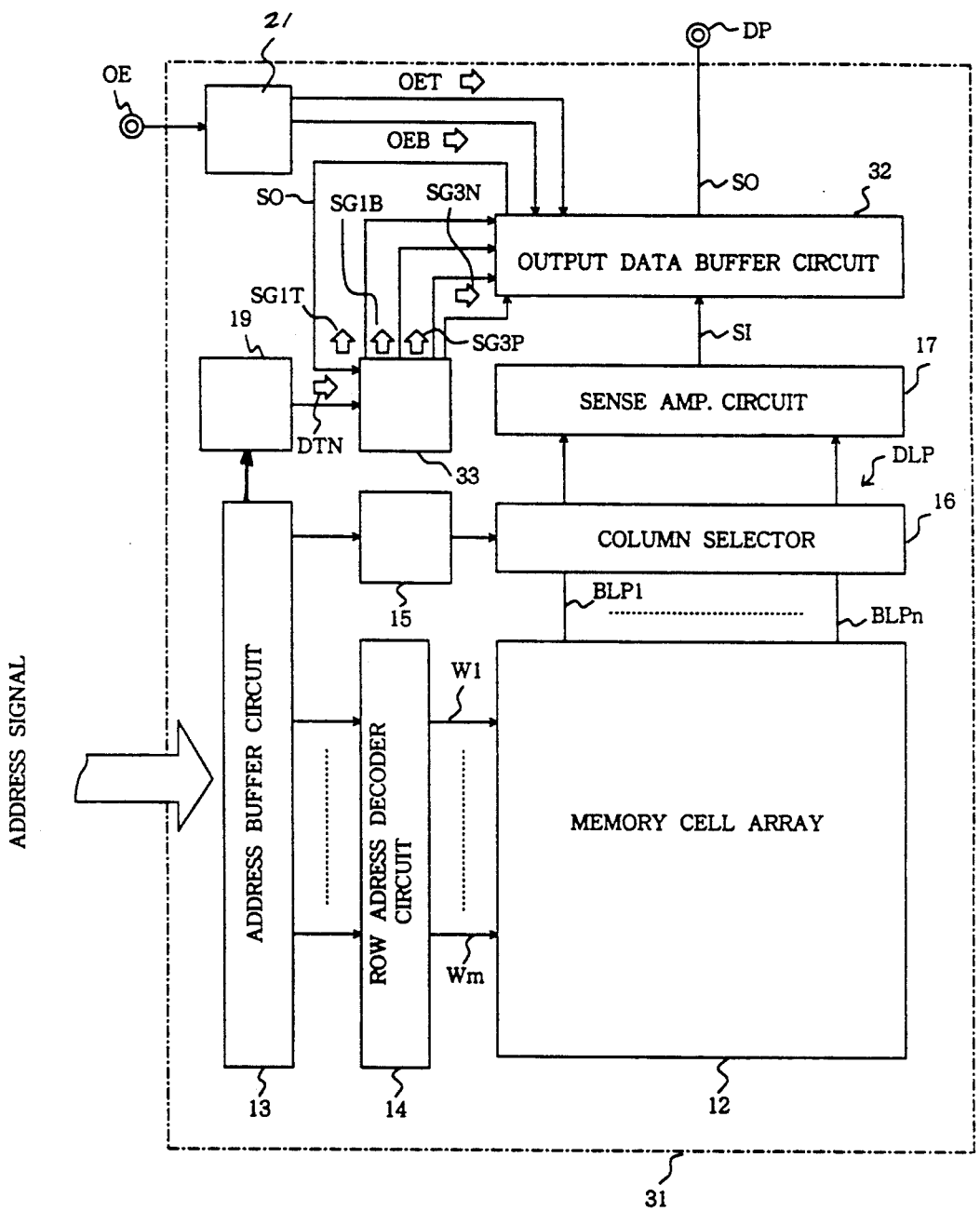
FIG. 7 is a block diagram showing the arrangement of another semiconductor memory device according to the present invention.
Figure 8:
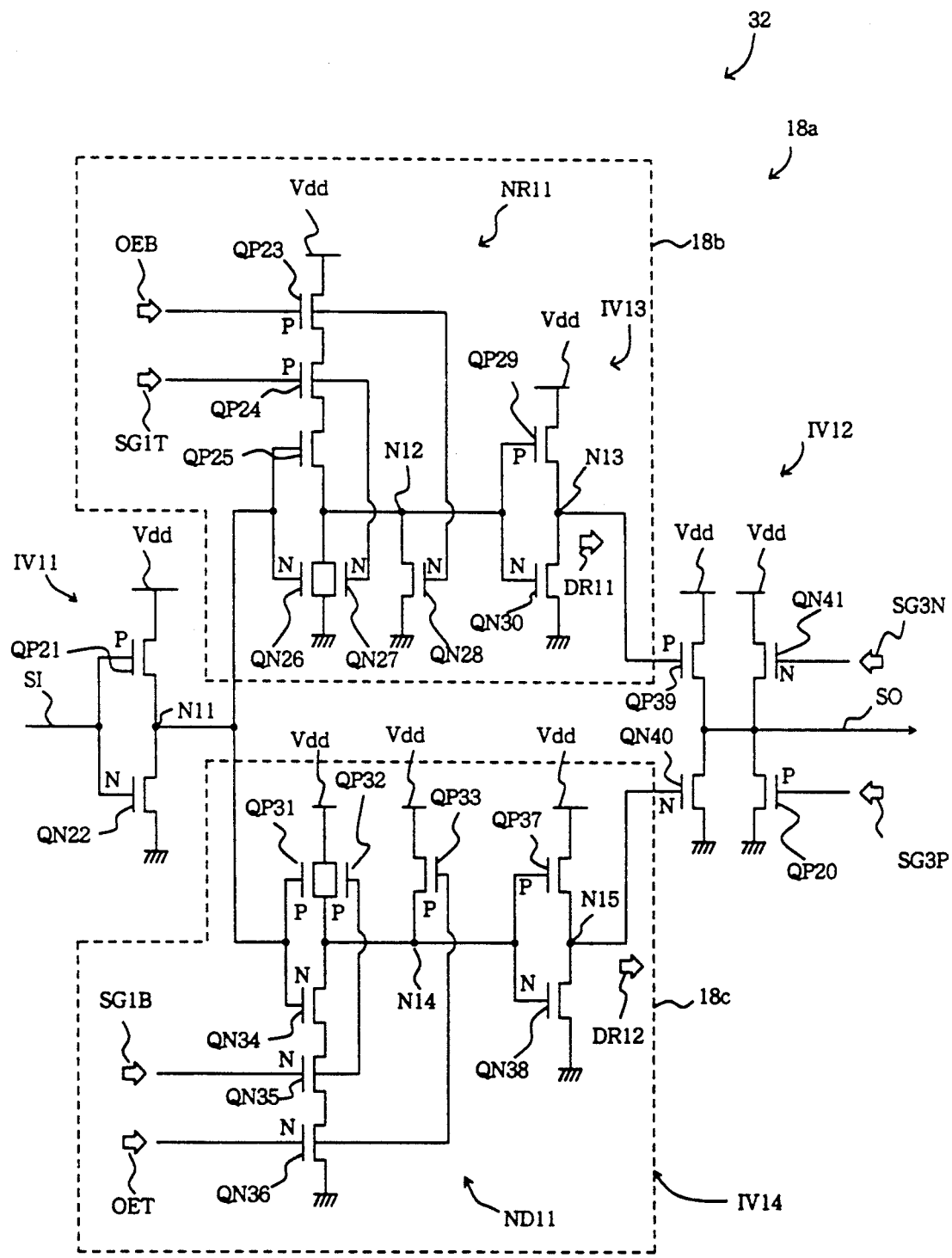
FIG. 8 is a circuit diagram showing the arrangement of an output data buffer circuit incorporated in the semiconductor memory device shown in FIG. 7.

Turning to FIG. 7 of the drawings, another semiconductor memory device embodying the present invention is fabricated on a single semiconductor chip 31. The semiconductor memory device implementing the second embodiment is similar in circuit arrangement to the first embodiment except for a data output buffer circuit 32 and a control signal generator 33, and, for this reason, the circuit components are labeled with the same references as those designating the corresponding circuit components of the first embodiment without any description.

Difference between the output data buffer circuits 18 and 32 is an n-channel enhancement type switching transistor QN41 controlled with a fourth control signal SG3N, and, accordingly, the control signal generator 33 produces not only the first to third control signals SG1T, SG1B and SG3P but also the fourth control signal SG3N. The voltage level on the output signal line SO is reported to the control signal generator 33, and the control signal generator 33 behaves as follows. First, control sequence of the first to third control signals SG1T, SG1B and SG3P is similar to that of the first embodiment, and the fourth control signal SG3N is fixed to the low level if the output signal line SO indicative of the previously accessed data bit, is at the high level, thereby maintaining the n-channel enhancement type switching transistor QN41 off. However, if the output signal line SO indicative of the previously accessed data bit is in the low level, the fourth control signal SG3N goes up to the high level, and the n-channel enhancement type switching transistor QN41 is turned on so that the output signal line SO voltage rises to a certain voltage level approximately equal to the threshold level Vtn of the n-channel enhancement type switching transistor QN41. The back-gate biasing effect is taken into account of, and the threshold level Vtn is about 2.5 volts in this instance. In this instance, the p-channel enhancement type switching transistor QP20 and the n-channel enhancement type switching transistor QN41 as a whole constitute a switching means, and the third and fourth control signals SG3P and SG3N serve as preceding signals, and are referred to as sub-signals of the preceeding signal. Control signal SG3P is activated when the preceding voltage level on said output signal line SO is a high voltage level, and control signal SG3N is activated when the preceding voltage level on said output signal line SO is a low voltage level.

Figure 9:
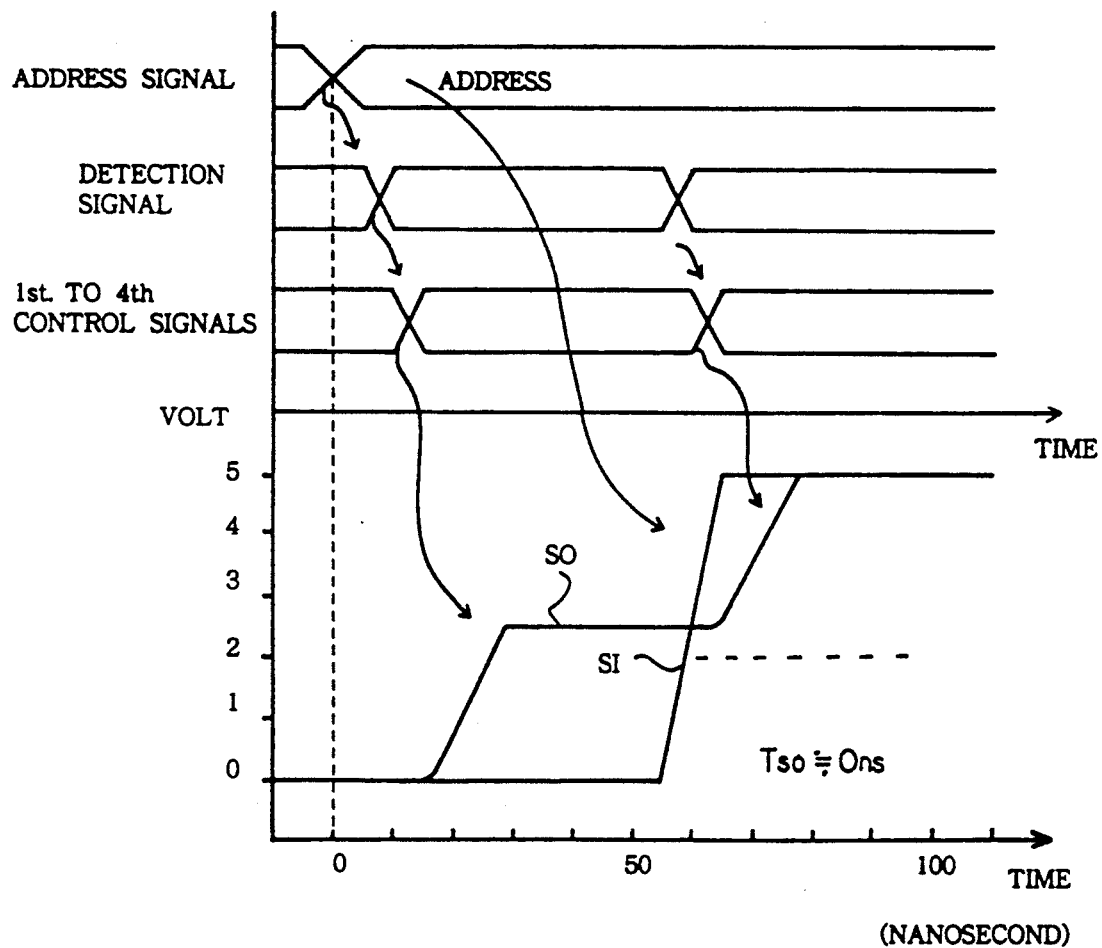
FIG. 9 is a graph showing the switching action of the output data buffer circuit shown in FIG. 8.

FIG. 9 shows the circuit behavior of the semiconductor memory device on the assumption that a data bit of logic "0" and a data bit of logic "1" are successively accessed from the memory cell. The previously accessed data bit of logic "0" level causes the output signal line SO to be in the low voltage level. When the address signal changes, the address monitor circuit 19 activates the detection signal, causing the control signal generator 33 to shift the first and second control signals SG1T and SG1B to the high level and the low level, respectively. Then, the first and second driving circuits 18b and 18c cause the inverters IV13 and IV14 to produce the first driving signal DR11 of the high level and the second driving signal DR12 of the low level so that the output inverter circuit IV12 enters the high-impedance state. When the address monitor circuit 19 shifts the detection signal to the active level, and the control signal generator 33 also shifts the fourth control signal SG3N to the (active) high level. The output signal line SO voltage rises to a predetermined voltage level approximately equal to the threshold level Vtn, i.e., 2.5 volts.

When the data bit of logic "1" level reaches the output data buffer circuit 32, the output enable buffer circuit 19 supplies the first and second enable signals OET and OEB to the output data buffer circuit 32, and the first and second driving circuits 18b and 18c become responsive to the voltage level on the signal input line SI and, accordingly, the output node N11. The first and second driving circuits 18b and 18c cause the inverter circuits IV13 and IV14 to produce the first and second driving signals DR11 and DR12 of the low level, and the output inverter IV12 allows the output signal line SO to be coupled with the power voltage line Vdd. Then, the output signal line SO is lifted to the power voltage level of 5 volts, and the time interval Tso is negligible or approximately equal to zero. Since the voltage level on the output signal line SO swings from 2.5 volts to 5 volts, the power voltage line Vdd and the ground voltage line are less liable to fluctuate, and malfunction hardly takes place in the other component circuits.

Although particular embodiments of the present invention have been shown and described, it will be obvious to those skilled in the art that various changes and modifications may be made without departing from the spirit and scope of the present invention. The output data buffer circuit may be applicable to any type of memory device as well as to a memory unit incorporated in a semiconductor integrated circuit device.

What is claimed is:

1. A semiconductor memory device fabricated on a single semiconductor chip, comprising:
   a) a memory cell array having a plurality of memory cells arranged in rows and columns, and respectively storing data bits;
   b) a plurality of word lines respectively associated with the row of said memory cell array, and responsive to an address signal for selectively reading out said data bits from said memory cell array;
   c) a data selecting means coupled with said memory cell array, and responsive to said address signal for selectively transferring said data bits read out from said memory cell array;
   d) a control means responsive to variation of said address signal, and producing a high-impedance state control signal and a preceding signal indicative of an instruction to vary a preceding voltage level to a predetermined point between high and low voltage levels; and
   e) a data buffer circuit operative to drive a data pin for supplying a data signal to the outside thereof, and comprising:
      e-1) an output inverter coupled with said data pin,
      e-2) driving means responsive to a data bit on said data selecting means, in the absence of said high-impedance state control signal, for controlling said output inverter in a second phase, said driving means being further operative to cause said output inverter to enter high-impedance state in the presence of said high-impedance state control signal in a first phase before said second phase, and e-3) a switching means coupled between said data pin and constant voltage source, and responsive to said preceding signal in said first phase, for coupling said data pin with said constant voltage source so that said data pin is shifted to said predetermined point before said driving means control said output inverter with said data bit.

2. A semiconductor memory device as set forth in claim 1, in which said switching means comprises a first switching transistor coupled between said data pin and a first power voltage line serving as said constant voltage source, and responsive to a first sub-signal of said preceding signal for providing a current path from said data pin to said first power voltage line.

3. A semiconductor memory device as set forth in claim 2, in which said control means produces said high-impedance state control signal upon said variation of said address signal, and supplies said preceding signal to said switching means before said data bit reaches said data buffer circuit.

4. A semiconductor memory device as set forth in claim 2, in which said switching means further comprises a second switching transistor coupled between said data pin and a second power voltage line, different in voltage level from said first power voltage line, responsive to a second sub-signal of said preceding signal for providing a current path from said data pin to said second power voltage line.

5. A semiconductor memory device as set forth in claim 4, in which said control means produces said high-impedance state control signal upon said variation of said address signal, and supplies said preceding signal to said switching means before said data bit reaches said data buffer circuit.

6. A semiconductor memory device fabricated on a single semiconductor chip, comprising:
a) a memory cell array having a plurality of memory cells arranged in rows and columns, and respectively storing data bits,
b) a plurality of word lines respectively associated with the rows of said memory cell array, and responsive to an address signal for selectively reading out said data bits from said memory cell array;
c) a data selecting means coupled with said memory cell array, and responsive to said address signal for selectively transferring said data bits read out from said memory cell array;
d) a control means supplied with a voltage level at an output data pin, and responsive to variation of said address signal for producing a high-impedance state control signal and either a first or second preceding signal depending upon the voltage level at said output data pin, either of said first or second preceding signals being indicative of an instruction to vary a preceding voltage level of said output data pin to a predetermined point between high and low voltage levels; and
e) a data buffer circuit operative to drive a data pin for supplying a data signal to the outside thereof, and comprising
e-1) an output inverter coupled with said data pin for driving said data input between said high and low voltage levels,
e-2) driving means responsive to a data bit on said data selecting means, in the absence of said high-impedance state control signal, for controlling said output inverter, said driving means being further operative to cause said output inverter to enter high-impedance state in the presence of said high-impedance state control signal, and
e-3) a switching means coupled between said data pin and sources of high and low voltage levels, and responsive to either of said first or second preceding signal for coupling said data pin with one of said sources of high and low voltage levels during said second phase so that said data pin is shifted to said predetermined point before said driving means controls said output inverter with said data bit.

* * * * *

UNITED STATES PATENT AND TRADEMARK OFFICE
CERTIFICATE OF CORRECTION

PATENT NO. : 5,295,098
DATED : March 15, 1994
INVENTOR(S) : Takaki KOHNO

It is certified that error appears in the above-identified patent and that said Letters Patent is hereby corrected as shown below:

Col. 3,    line 52, after "time", insert --interval Tso' is longer than--

Col. 3,    line 53, delete "and Tso", insert --and Tso'--.

Signed and Sealed this

Twenty-third Day of August, 1994

Attest:

BRUCE LEHMAN

Attesting Officer    Commissioner of Patents and Trademarks